(12) United States Patent
Winkler et al.

(10) Patent No.: US 8,987,687 B2
(45) Date of Patent: Mar. 24, 2015

(54) SILICOPHOSPHATE PHOSPHORS

(75) Inventors: Holger Winkler, Darmstadt (DE); Thomas Juestel, Witten (DE); Arturas Kastelnikovas, Steinfurt (DE); Olga Darcanova, Steinfurt (DE)

(73) Assignee: Merck Patent GmbH, Darmstadt (DE)

( * ) Notice: Subject to any disclaimer, the term of this patent is extended or adjusted under 35 U.S.C. 154(b) by 121 days.

(21) Appl. No.: 13/822,701

(22) PCT Filed: Aug. 16, 2011

(86) PCT No.: PCT/EP2011/004104
§ 371 (c)(1),
(2), (4) Date: Mar. 13, 2013

(87) PCT Pub. No.: WO2012/034625
PCT Pub. Date: Mar. 22, 2012

(65) Prior Publication Data
US 2013/0168574 A1 Jul. 4, 2013

(30) Foreign Application Priority Data

Sep. 14, 2010 (DE) .................. 10 2010 045 368

(51) Int. Cl.
*C09K 11/77* (2006.01)
*C09K 11/08* (2006.01)
*H01L 33/50* (2010.01)

(52) U.S. Cl.
CPC ......... *C09K 11/7796* (2013.01); *C09K 11/0883* (2013.01); *C09K 11/7734* (2013.01); *C09K 11/7792* (2013.01); *H01L 33/502* (2013.01)
USPC .................. 250/459.1; 252/301.4 P (58) Field of Classification Search
CPC .................................................. C09K 11/7796
USPC ..................... 250/459.1; 252/301.4 P, 519.14
See application file for complete search history.

(56) References Cited

U.S. PATENT DOCUMENTS

| 4,151,443 A | 4/1979 | Boom et al. |
| 7,514,020 B2 * | 4/2009 | Zeng et al. .............. 252/301.4 F |
| 2006/0231851 A1 | 10/2006 | Setlur et al. |
| 2009/0114939 A1 | 5/2009 | Schmidt et al. |

FOREIGN PATENT DOCUMENTS

| CN | 101 029 231 | 9/2007 |
| CN | 101 597 493 | 12/2009 |

OTHER PUBLICATIONS

International Search Report for PCT/EP2011/004104, Date of completion of actual search: Oct. 21, 2011, Date of mailing of international search report: Nov. 7, 2011.

(Continued)

*Primary Examiner* — David Porta
*Assistant Examiner* — Faye Boosalis
(74) *Attorney, Agent, or Firm* — Millen, White, Zelano & Branigan, P.C.

(57) ABSTRACT

The invention relates to compounds of the general formula I $$(Ba_{1-a-b}Sr_aEu_b)_{2+x}(Lu_{1-c-d}Y_cGd_d)_{2-x}(PO_4)_{2+x}(SiO_4)_{1-x} \quad (I)$$

where
b stands for a value from the range $0 < b \leq 0.2$
a, c, d stand, independently of one another, for a value from the range from 0 to 1
x stands for a value from the range from 0 to 0.8, and to a process for the preparation of these phosphors and to the use thereof as conversion phosphors or in lamps.

22 Claims, 9 Drawing Sheets

(56) References Cited

OTHER PUBLICATIONS

Dechun Sun, "Alkaline-earth metal phosphosilicate phosphor powder and preparation method and application thereof," Espacenet, Publication Date: Dec. 9, 2009; English Abstract of CN-101597493.

Univ Fudan, "Bivalent-europium-excited base-metal silicate phosphate fluorescent powder and its production," Espacenet, Publication Date: Sep. 5, 2007; English Abstract of CN-101029231.

* cited by examiner

SILICOPHOSPHATE PHOSPHORS

The invention relates to silicophosphate compounds, to a process for the preparation of these compounds and to the use thereof as conversion phosphors or in lamps.

Inorganic phosphors are used in fluorescent light sources, emissive display screens and as scintillator crystals or ceramics for the conversion of invisible radiation or high-energy particles into visible light. Classes of material which have found widespread use for this job are $Ce^{3+}$-doped garnets, of the general composition $(Y_{1-w-x-y-z}Gd_xLu_yTb_z)_3(Al_{1-a-b}Ga_aSc_b)_5O_{12}:Ce_w$, where the variation in the composition can be used for optimisation of the spectrum, the stability, the decay time and/or for circumventing patent claims.

As long ago as 1996, i.e. shortly after the industrial implementation of a blue-emitting (In,Ga)N LED having high energy efficiency and a luminous flux of several candelas, white LEDs were achieved by the partial conversion of the blue light using precisely these garnets, since the yellow-orange emission colour of these phosphors is complementary to the blue emission colour of the LED, and white light is thus obtained by additive colour mixing.

To date, many commercially available white-emitting LEDs therefore contain a blue-emitting (In,Ga)N semiconductor chip which is coated with a luminescent screen consisting of a ceramic $Ce^{3+}$-doped garnet.

Nevertheless, the search for alternative yellow-orange-emitting converter materials for high-performance LEDs continues undiminished. At present, mainly $Ce^{3+}$- or $Eu^{2+}$-doped nitrides and oxynitrides are at the centre of interest since the high centroid shift in these host lattices means that these activators exhibit luminescence in the green to red spectral region, while both $Ce^{3+}$ and also $Eu^{2+}$ luminesce mainly in the UV or blue spectral region in most purely oxidic materials.

Phosphors based on the eulytine structure were described for the first time by G. Blasse [J. Sol. State Chem. 2, 27-30 (1970)]. However, only compositions doped with $Eu^{3+}$ or $Ce^{3+}$ have been investigated to date. However, these are not suitable for excitation using blue LEDs.

The object of the present invention was to develop silicophosphate phosphors which have yellow-orange luminescence and are particularly suitable for use in high-performance pcLEDs for the generation of cold-white light.

Surprisingly, it has now been found that $Eu^{2+}$-doped alkaline-earth metal/lutetium-containing silicophosphate phosphors achieve the above-mentioned object. Owing to the very broad fluorescent band and the colour point, these phosphors are particularly suitable for the generation of cold-white light. They are distinguished over the known $Eu^{3+}$- or $Ce^{3+}$-doped $Ba_2Y_2(PO_4)_2(SiO_4)$ phosphors by the higher absorption strength in the blue spectral region.

A first embodiment of the present invention is therefore a compound of the formula I, $$(Ba_{1-a-b}Sr_aEu_b)_{2+x}(Lu_{1-c-d}Y_cGd_d)_{2-x}(PO_4)_{2+x}(SiO_4)_{1-x} \quad (I)$$

where
b stands for a value from the range $0 < b \leq 0.2$
a, c, d stand, independently of one another, for a value from the range from 0 to 1
x stands for a value from the range from 0 to 0.8.
x preferably stands for a value from the range 0.05 to 0.5 and particularly preferably from the range 0.1 to 0.3.
a preferably stands for a value from the range 0 to 0.5, particularly preferably from the range 0 to 0.2.
b preferably stands for a value from the range $0 < b < 0.1$.
c and d preferably stand, independently of one another, for a value from the range from 0 to 0.8.

For simplification, the compounds of the formula I according to the invention and the mixtures of above-mentioned compounds according to the invention are jointly also referred to below as phosphors.

Phosphors according to the invention give rise to good LED qualities even when employed in small amounts. The LED quality here is described by means of conventional parameters, such as, for example, the colour rendering index or the colour point in CIE x and CIE y coordinates.

The colour rendering index or CRI is a dimensionless lighting quantity, familiar to the person skilled in the art, which compares the colour reproduction faithfulness of an artificial light source to that of sunlight or filament light sources (the latter two have a CRI of 100).

CIE x and CIE y stand for the coordinates in the standard CIE colour chart (here standard observer 1931), familiar to the person skilled in the art, by means of which the colour of a light source is described.

All the quantities mentioned above are calculated from emission spectra of the light source by methods familiar to the person skilled in the art.

In the context of this application, the term yellow-orange light denotes light whose intensity maximum is at a wavelength between 560 and 590 nm, and the term red light denotes light whose maximum is at a wavelength between 600 and 670 nm.

The invention furthermore relates to a process for the preparation of a compound of the formula I, comprising the following steps:
a) mixing of lutetium-, europium-, silicon-, barium-, strontium-, yttrium-, gadolinium- and/or phosphate-containing materials
b) addition of at least one further inorganic and/or organic substance
c) thermal treatment of the mixture.

In the case of the above-mentioned thermal treatment, it is preferred for this to be carried out, at least partly, under reducing conditions. In step c), the reaction is usually carried out at a temperature above 800° C. The thermal treatment is preferably carried out in a multistep process, particularly preferably in 3 steps, i.e. firstly the mixture is calcined under air at a temperature >900° C. and subsequently preferably heated under reducing conditions at a temperature above 1400° C., particularly preferably at T=1500 to 1700° C. The reducing conditions are established here, for example, using carbon monoxide, forming gas or hydrogen or at least vacuum or an oxygen-deficient atmosphere, preferably under carbon monoxide. After grinding, the mixture is calcined again at a temperature >1000° C., preferably between 1100 and 1300° C., preferably under a forming gas $N_2/H_2$ stream and particularly preferably in an $N_2/H_2$ stream (90-70:10-30).

The inorganic or organic substance employed (in step b) is a substance from the group of the ammonium halides, preferably ammonium chloride, alkaline-earth metal fluorides, such as calcium fluoride, strontium fluoride or barium fluoride, borates, boric acid, carbonates, preferably ammonium hydrogencarbonate, alcoholates, such as oxalates, and/or silicic acid, such as tetraethyl orthosilicate (TEOS).

The phosphors according to the invention can be prepared either by a conventional solid-state diffusion method (starting from the oxides, nitrates, carbonates or halides of the corresponding alkaline-earth metals, semi-metals, metals or rare earths) or by wet-chemical methods from inorganic and/or organic metal and/or rare-earth salts by means of the sol-gel method, the coprecipitation method and/or the drying method. The solid-state diffusion method is preferred in accordance with the invention.

In the wet-chemical processes via aqueous precursors of the phosphors, the following methods are known:

- Coprecipitation using an $NH_4HCO_3$ solution (see, for example, *Jander, Blasius Lehrbuch der analyt. u. präp. anorg. Chem.* 2002 *[Blasius's Textbook of Analyt. and Prep. Inorg. Chem.* 2002])
- Pecchini process using a solution of citric acid and ethylene glycol (see, for example, *Annual Review of Materials Research Vol.* 36: 2006, 281-331)
- Combustion process using urea
- Spray drying of aqueous or organic salt solutions (starting materials)
- Spray pyrolysis of aqueous or organic salt solutions (starting materials)
- Evaporation of nitrate solutions and thermal conversion of the residue In the above-mentioned coprecipitation, a $TEOS/NH_4HCO_3$ solution is added to, for example, chloride solutions of the corresponding phosphor starting materials, resulting in the formation of the phosphor precursor, which is subsequently converted into the phosphor by one- or multi-step thermal treatment.

In the Pecchini process, a precipitation reagent consisting of citric acid and ethylene glycol is added to, for example, nitrate solutions of the corresponding phosphor starting materials at room temperature, and the mixture is subsequently heated. The increase in viscosity results in the formation of the phosphor precursor.

In the known combustion process, nitrate solutions, for example, of the corresponding starting materials are dissolved in water, the solution is then refluxed, and urea is added, resulting in the slow formation of the phosphor precursor.

Spray pyrolysis is one of the aerosol processes, which are characterised by spraying of solutions, suspensions or dispersions into a reaction space (reactor) heated in various ways and the formation and deposition of solid particles. In contrast to spray drying at hot-gas temperatures <200° C., spray pyrolysis, as a high-temperature process, involves thermal decomposition of the starting materials used (for example salts) and the re-formation of substances (for example oxides or mixed oxides) in addition to evaporation of the solvent.

The 6 process variants mentioned above are described in detail in WO 2007/144060 (Merck), which is incorporated in its full scope into the context of the present application by way of reference.

The yellow/orange-emitting phosphors according to the invention can also be mixed with red-emitting phosphors, making such mixtures very highly suitable for applications in general lighting (for example for warm-white LEDs) and LCD backlighting.

A further embodiment of the present invention is therefore a mixture comprising at least one compound of the formula I and at least one red-emitting phosphor, where the latter is preferably selected from Ce-doped garnets, Eu-doped thiogallates, Eu-doped sulfoselenides and Eu- and/or Ce-doped nitrides, oxynitrides, alumonitrides and/or Mn(IV)-doped oxides and/or fluorides. It may be particularly preferred for the red-emitting phosphor to be selected from the nitridic phosphors, preferably $(Ca,Sr,Ba)_2Si_5N_8$:Eu, $(Ca,Sr)AlSiN_3$:Eu, $(Ca,Sr,Ba)SiN_2$:Eu, $(Ca,Sr,Ba)_6Si_3O_6N_4$:Eu, $A_{2-0.5y-x}Eu_xSi_5N_{8-y}O_y$, where A stands for one or more elements selected from Ca, Sr, Ba, and x stands for a value from the range from 0.005 to 1 and y stands for a value from the range from 0.01 to 3, or variants of the said compounds in which individual lattice positions are substituted by other chemical elements, such as alkali metals, aluminium, gallium or gadolinium, or further elements of this type occupy flaws as dopant. Material systems which are known to the person skilled in the art and are suitable are siliconitrides and alumosiliconitrides (cf. Xie, Sci. Technol. Adv. Mater. 2007, 8, 588-600): 1-1-2-nitrides, such as, for example, $CaSiN_2$:$Eu^{2+}$ (Le Toquin, Cheetham, Chem. Phys. Lett. 2006, 423, 352), 2-5-8-nitrides, such as $(Ca,Sr,Ba)_2Si_5N_5$:$Eu^{2+}$ (Li et al., Chem. Mater. 2005, 15, 4492), and alumosiliconitrides, such as $(Ca,Sr)AlSiN_3$:$Eu^{2+}$ (K. Uheda et al., Electrochem. Solid State Lett. 2006, 9, H22).

The compound $A_{2-0.5y-x}Eu_xSi_5N_{8-y}O_y$, where A stands for one or more elements selected from Ca, Sr, Ba, and x stands for a value from the range from 0.005 to 1 and y stands for a value from the range from 0.01 to 3, is described in patent application EP10000933.1 and is called compound of the formula II below. The compound can be present here as a pure substance or in a mixture with at least one further silicon- and oxygen-containing compound, it being preferred for the at least one further silicon- and oxygen-containing compound to be a reaction by-product of the preparation of the compound of the formula II and for this not to adversely affect the application-relevant optical properties of the compound of the formula II. The invention therefore furthermore relates to a mixture comprising a compound of the formula II, which mixture is obtainable by a process in which, in a step a), suitable starting materials selected from binary nitrides, halides and oxides or corresponding reactive forms thereof are mixed, and, in a step b), the mixture is thermally treated under reductive conditions. In the compounds of the formula II according to the invention, A in preferred embodiments stands for Sr, while x in preferred embodiments stands for a value from the range from 0.01 to 0.8, preferably from the range 0.02 to 0.7 and particularly preferably from the range 0.05 to 0.6 and very particularly preferably from the range 0.1 to 0.4, and y in preferred embodiments stands for a value from the range from 0.1 to 2.5, preferably from the range 0.2 to 2 and particularly preferably from the range 0.22 to 1.8.

For the preparation of phosphors of the formula II, suitable starting materials selected from binary nitrides, halides and oxides or corresponding reactive forms thereof are mixed in a step a), and the mixture is thermally treated under reductive conditions in a step b). In the above-mentioned thermal treatment, it is preferred for this to be carried out at least partly under reducing conditions. In step b), the reaction is usually carried out at a temperature above 800° C., preferably at a temperature above 1200° C. and particularly preferably in the range 1400° C.-1800° C. The reductive conditions here are established, for example, using carbon monoxide, forming gas or hydrogen or at least vacuum or an oxygen-deficient atmosphere, preferably in a stream of nitrogen, preferably in a stream of $N_2/H_2$ and particularly preferably in a stream of $N_2/H_2/NH_3$. If it is intended to prepare the compounds of the formula II in pure form, this can be carried out either via precise control of the starting-material stoichiometry or by mechanical separation of the crystals of the compounds of the formula II from the glass-like fractions. The separation can be carried out, for example, via the different density, particle shape or particle size by separation methods known to the person skilled in the art.

In accordance with the invention, the compound (or phosphor) of the formula I and the at least one red-emitting phosphor are usually present here in the weight ratio 20:1 to 1:1. It is preferred in accordance with the invention for the at least one phosphor of the formula I and the at least one redemitting phosphor to be present in the weight ratio 10:1 to 3:1 and particularly preferably 6:1 to 4:1.

The invention furthermore relates to a process for the preparation of a phosphor mixture in which at least one compound (or phosphor) of the formula I is mixed with at least one red-emitting phosphor.

The particle size of the phosphors according to the invention is usually between 50 nm and 30 µm, preferably between 1 µm and 20 µm.

In a further preferred embodiment, the phosphors in particle form have a continuous surface coating consisting of $SiO_2$, $TiO_2$, $Al_2O_3$, ZnO, $ZrO_2$ and/or $Y_2O_3$ or mixed oxides thereof. This surface coating has the advantage that, through a suitable grading of the refractive indices of the coating materials, the refractive index can be matched to the environment. In this case, the scattering of light at the surface of the phosphor is reduced and a greater proportion of the light can penetrate into the phosphor and be absorbed and converted therein. In addition, the refractive index-matched surface coating enables more light to be coupled out of the phosphor since total internal reflection is reduced.

In addition, a continuous layer is advantageous if the phosphor has to be encapsulated. This may be necessary in order to counter sensitivity of the phosphor or parts thereof to diffusing water or other materials in the immediate environment. A further reason for encapsulation with a closed shell is thermal decoupling of the actual phosphor from the heat generated in the chip. This heat results in a reduction in the fluorescence light yield of the phosphor and may also influence the colour of the fluorescence light. Finally, a coating of this type enables the efficiency of the phosphor to be increased by preventing lattice vibrations arising in the phosphor from propagating to the environment.

In addition, it is preferred for the phosphors to have a porous surface coating consisting of $SiO_2$, $TiO_2$, $Al_2O_3$, ZnO, $ZrO_2$ and/or $Y_2O_3$ or mixed oxides thereof or of the phosphor composition. These porous coatings offer the possibility of further reducing the refractive index of a single layer. Porous coatings of this type can be produced by three conventional methods, as described in WO 03/027015, which is incorporated in its full scope into the context of the present application by way of reference: the etching of glass (for example soda-lime glasses (see U.S. Pat. No. 4,019,884)), the application of a porous layer, and the combination of a porous layer and an etching operation.

In a further preferred embodiment, the phosphor particles have a surface which carries functional groups which facilitate chemical bonding to the environment, preferably consisting of epoxy or silicone resin. These functional groups can be, for example, esters or other derivatives which are bonded via oxo groups and are able to form links to constituents of the binders based on epoxides and/or silicones. Surfaces of this type have the advantage that homogeneous incorporation of the phosphors into the binder is facilitated. Furthermore, the rheological properties of the phosphor/binder system and also the pot lives can thereby be adjusted to a certain extent. Processing of the mixtures is thus simplified.

Since the phosphor layer according to the invention applied to the LED chip preferably consists of a mixture of silicone and homogeneous phosphor particles which is applied by bulk casting, and the silicone has a surface tension, this phosphor layer is not uniform at a microscopic level or the thickness of the layer is not constant throughout. This is generally also the case if the phosphor is not applied by the bulk-casting process, but instead in the so-called chip-level conversion process, in which a highly concentrated, thin phosphor layer is applied directly to the surface of the chip with the aid of electrostatic methods.

With the aid of the above-mentioned process, it is possible to produce any desired outer shapes of the phosphor particles, such as spherical particles, flakes and structured materials and ceramics.

The preparation of flake-form phosphors as a further preferred embodiment is carried out by conventional processes from the corresponding metal and/or rare-earth salts. The preparation process is described in detail in EP 763573 and DE 102006054331, which are incorporated in their full scope into the context of the present application by way of reference. These flake-form phosphors can be prepared by coating a natural or synthetically prepared, highly stable support or a substrate comprising, for example, mica, $SiO_2$, $Al_2O_3$, $ZrO_2$, glass or $TiO_2$ flakes which has a very large aspect ratio, an atomically smooth surface and an adjustable thickness with a phosphor layer by a precipitation reaction in aqueous dispersion or suspension. Besides mica, $ZrO_2$, $SiO_2$, $Al_2O_3$, glass or $TiO_2$ or mixtures thereof, the flakes may also consist of the phosphor material itself or be built up from one material. If the flake itself merely serves as support for the phosphor coating, the latter must consist of a material which is transparent to the primary radiation of the LED, or absorbs the primary radiation and transfers this energy to the phosphor layer. The flake-form phosphors are dispersed in a resin (for example silicone or epoxy resin), and this dispersion is applied to the LED chip.

The flake-form phosphors can be prepared on a large industrial scale in thicknesses of 50 nm to about 20 µm, preferably between 150 nm and 5 µm. The diameter here is 50 nm to 20 µm.

It generally has an aspect ratio (ratio of the diameter to the particle thickness) of 1:1 to 400:1 and in particular 3:1 to 100:1.

The flake dimensions (length×width) are dependent on the arrangement. Flakes are also suitable as centres of scattering within the conversion layer, in particular if they have particularly small dimensions.

The surface of the flake-form phosphor according to the invention facing the LED chip can be provided with a coating which has an antireflection action with respect to the primary radiation emitted by the LED chip. This results in a reduction in back-scattering of the primary radiation, enabling the latter to be coupled better into the phosphor body according to the invention. Suitable for this purpose are, for example, coatings of matched refractive index, which must have a following thickness d: d=[wavelength of the primary radiation of the LED chip/(4*refractive index of the phosphor ceramic)], see, for example, Gerthsen, Physik [Physics], Springer Verlag, 18th Edition, 1995. This coating may also consist of photonic crystals, which also includes structuring of the surface of the flake-form phosphor in order to achieve certain functionalities.

The production of the phosphors according to the invention in the form of ceramic bodies is carried out analogously to the process described in DE 102006037730 (Merck), which is incorporated in its full scope into the context of the present application by way of reference. In this process, the phosphor is prepared by wet-chemical methods by mixing the corresponding starting materials and dopants, subsequently subjected to isostatic pressing and applied directly to the surface of the chip in the form of a homogeneous, thin and non-porous flake. There is thus no location-dependent variation of the excitation and emission of the phosphor, which means that the LED provided therewith emits a homogeneous light cone of constant colour and has high light output. The ceramic phosphor bodies can be produced on a large industrial scale, for example, as flakes in thicknesses of a few 100 nm to about 500 μm. The flake dimensions (length×width) are dependent on the arrangement. In the case of direct application to the chip, the size of the flake should be selected in accordance with the chip dimensions (from about 100 μm*100 μm to several mm$^2$) with a certain oversize of about 10% to 30% of the chip surface with a suitable chip arrangement (for example flip-chip arrangement) or correspondingly. If the phosphor flake is installed over a finished LED, all of the exiting light cone passes through the flake.

The side surfaces of the ceramic phosphor body can be coated with a light metal or noble metal, preferably aluminium or silver. The metal coating has the effect that light does not exit laterally from the phosphor body. Light exiting laterally can reduce the luminous flux to be coupled out of the LED. The metal coating of the ceramic phosphor body is carried out in a process step after the isostatic pressing to give rods or flakes, where the rods or flakes can optionally be cut to the requisite size before the metal coating.

To this end, the side surfaces are wetted, for example, with a solution comprising silver nitrate and glucose and subsequently exposed to an ammonia atmosphere at elevated temperature. A silver coating, for example, forms on the side surfaces in the process.

Alternatively, currentless metallisation processes are also suitable, see, for example, Hollemann-Wiberg, Lehrbuch der Anorganischen Chemie [Textbook of Inorganic Chemistry], Walter de Gruyter Verlag or Ullmanns Enzyklopädie der chemischen Technologie [Ullmann's Encyclopaedia of Chemical Technology].

The ceramic phosphor body can, if necessary, be fixed to the baseboard of an LED chip using a water-glass solution.

In a further embodiment, the ceramic phosphor body has a structured (for example pyramidal) surface on the side opposite an LED chip. This enables as much light as possible to be coupled out of the phosphor body. The structured surface on the phosphor body is produced by carrying out the isostatic pressing using a compression mould having a structured pressure plate and thus embossing a structure into the surface. Structured surfaces are desired if the aim is to produce the thinnest possible phosphor bodies or flakes. The pressing conditions are known to the person skilled in the art (see J. Kriegsmann, Technische keramische Werkstoffe [Industrial Ceramic Materials], Chapter 4, Deutscher Wirtschaftsdienst, 1998). It is important that the pressing temperatures used are ⅔ to ⅚ of the melting point of the substance to be pressed.

In addition, the phosphors according to the invention can be excited over a broad range, extending from about 410 nm to 530 nm, preferably 430 nm to about 500 nm. These phosphors are thus not only suitable for excitation by violet- or blue-emitting light sources, such as LEDs or conventional discharge lamps (for example based on Hg), but also for light sources such as those which utilise the blue In$^{3+}$ line at 451 nm.

The present invention furthermore relates to a light source, characterised in that it comprises a semiconductor and at least one phosphor of the formula I.

The present invention furthermore relates to a light source, characterised in that it comprises a semiconductor and at least one compound of the formula I and at least one red-emitting phosphor. This lighting unit is preferably white-emitting or emits light having a certain colour point (colour-on-demand principle).

The colour-on-demand concept is taken to mean the production of light having a certain colour point using a pcLED (=phosphor-converted LED) using one or more phosphors. This concept is used, for example, in order to produce certain corporate designs, for example for illuminated company logos, trademarks, etc.

In a preferred embodiment of the light source according to the invention, the semiconductor is a luminescent indium aluminium gallium nitride, in particular of the formula $In_iGa_jAl_kN$, where $0≤i, 0≤j, 0≤k$, and $i+j+k=1$.

In a further preferred embodiment of the light source according to the invention, the light source is a luminescent arrangement based on ZnO, TCO (transparent conducting oxide), ZnSe or SiC or an arrangement based on an organic light-emitting layer (OLED).

In a further preferred embodiment of the light source according to the invention, the light source is a source which exhibits electroluminescence and/or photoluminescence. The light source may furthermore also be a plasma or discharge source.

Possible forms of light sources of this type are known to the person skilled in the art. These can be light-emitting LED chips of various structure.

The phosphors according to the invention can either be dispersed in a resin (for example epoxy or silicone resin) or, in the case of suitable size ratios, arranged directly on the light source or alternatively arranged remote therefrom, depending on the application (the latter arrangement also includes "remote phosphor technology"). The advantages of remote phosphor technology are known to the person skilled in the art and are revealed, for example, by the following publication: Japanese Journ. of Appl. Phys. Vol. 44, No. 21 (2005) L649-L651.

The invention furthermore relates to a lighting unit, in particular for the backlighting of display devices, which is characterised in that it comprises at least one light source described above, and to corresponding display devices, in particular liquid-crystal display devices (LC displays), having backlighting, which are characterised in that they comprise at least one lighting unit of this type.

Preference is furthermore given to a lighting unit, in particular for general lighting, which is characterised in that it has a CRI (=colour rendering index)>60, preferably >70, more preferably >85. However, CRI values >85 can only be achieved if the yellow-orange phosphor of the formula I according to the invention is additionally combined with red phosphors in the LED.

In a further embodiment, it is preferred for the optical coupling of the lighting unit between the phosphor and the semiconductor to be achieved by a light-conducting arrangement.

This makes it possible for the semiconductor to be installed at a central location and to be optically coupled to the phosphor by means of light-conducting devices, such as, for example, optical fibres. In this way, it is possible to achieve lamps adapted to the lighting wishes which merely consist of one or various phosphors, which can be arranged to form a light screen, and an optical waveguide, which is coupled to the light source. In this way, it is possible to place a strong light source at a location which is favourable for electrical installation and to install lamps comprising phosphors which are coupled to the optical waveguides at any desired locations without further electrical cabling, but instead only by laying optical waveguides.

The present invention furthermore relates to the use of the phosphors according to the invention for the partial or complete conversion of the blue or near-UV emission from a luminescent diode.

Preference is furthermore given to the use of the phosphors according to the invention for the conversion of the blue or near-UV emission into visible white radiation. Preference is furthermore given to the use of the phosphors according to the invention for the conversion of the primary radiation into a certain colour point in accordance with the "colour-on-demand" concept.

The present invention furthermore relates to the use of the phosphors according to the invention in electroluminescent materials, such as, for example, electroluminescent films (also known as lighting films or light films), in which, for example, zinc sulfide or zinc sulfide doped with $Mn^{2+}$, $Cu^+$ or $Ag^+$ is employed as emitter, which emit in the yellow-green region. The areas of application of the electroluminescent film are, for example, advertising, display backlighting in liquid-crystal display screens (LC displays) and thin-film transistor (TFT) displays, self-illuminating vehicle licence plates, floor graphics (in combination with a crush-resistant and slip-proof laminate), in display and/or control elements, for example in automobiles, trains, ships and aircraft, or also domestic appliances, garden equipment, measuring instruments or sport and leisure equipment.

The following examples are intended to illustrate the present invention. However, they should in no way be regarded as limiting. All compounds or components which can be used in the compositions are either known and commercially available or can be synthesised by known methods. The temperatures indicated in the examples are always in °C. It furthermore goes without saying that, both in the description and also in the examples, the added amounts of the components in the compositions always add up to a total of 100%. Percentage data given should always be regarded in the given context. However, they usually always relate to the weight of the part-amount or total amount indicated.

Even without further comments, it is assumed that a person skilled in the art will be able to utilise the above description in its broadest scope. The preferred embodiments should therefore merely be regarded as descriptive disclosure which is absolutely not limiting in any way. The complete disclosure content of all applications and publications mentioned above and below is incorporated into this application by way of reference. The following examples are intended to illustrate the present invention. However, they should in no way be regarded as limiting. All compounds or components which can be used in the compositions are either known and commercially available or can be synthesised by known methods.

EXAMPLES

Example 1

Preparation of $Ba_{2.178}Eu_{0.022}Lu_{1.8}(PO_4)_{2.2}(SiO_4)_{0.8}$ 0.0172 g (0.049 mmol) of $Eu_2O_3$, 1.5918 g (4.000 mmol) of $Lu_2O_3$, 1.2912 g (9.778 mmol) of $(NH_4)_2HPO_4$, 1.9103 g (9.680 mmol) of $BaCO_3$, 0.2136 g (3.555 mmol) of $SiO_2$ and 0.02 g (0.323 mmol) of $H_3BO_3$ are slurried with acetone and mixed thoroughly in an agate mortar. The powder is dried and calcined at 1000° C. for 5 h in air for phase formation. The powder is subsequently heated for 10 h at 1550° C. under CO in order that crystallisation commences and europium is reduced to the divalent state. Finally, after grinding, the powder is subjected to calcination again, this time for 5 h at 1200° C. under forming gas $N_2/H_2$ (90/10), in order to fully reduce $Eu^{3+}$ remaining. The sinter cake obtained is ground and sieved through a 36 μm sieve.

The CIE1931 colour point of the phosphor is at x=0.436 and y=0.467, where the lumen equivalent is 301 lm/W.

Example 2

Preparation of $Ba_{2.112}Eu_{0.088}Lu_{1.8}(PO_4)_{2.2}(SiO_4)_{0.8}$ 0.0687 g (0.195 mmol) of $Eu_2O_3$, 1.5900 g (3.996 mmol) of $Lu_2O_3$, 1.2899 g (9.778 mmol) of $(NH_4)_2HPO_4$, 1.8504 g (9.377 mmol) of $BaCO_3$, 0.2134 g (3.552 mmol) of $SiO_2$ and 0.02 g (0.323 mmol) of $H_3BO_3$ are slurried with acetone and mixed thoroughly in an agate mortar. The powder is dried and calcined in air for 5 h at 1000° C. for phase formation. The mixture is subsequently heated for 10 h at 1550° C. under CO in order that crystallisation commences and europium is reduced to the divalent state. Finally, after grinding, the powder is subjected to calcination again, this time for 5 h at 1200° C. under forming gas $N_2/H_2$ (90/10), in order to fully reduce $Eu^{3+}$ remaining. The sinter cake obtained is ground and sieved through a 36 μm sieve.

The CIE1931 colour point of the phosphor is at x=0.426 and y=0.472, where the lumen equivalent is 307 lm/W.

Preparation of Nitridic Phosphors for Mixtures

Example 3A

Preparation of $Sr_{1.8}Si_5N_{7.6}O_{0.4}$:Eu 13.96 g of $Sr_3N_2$, 0.996 g of EuN and 4.512 g of silicon dioxide are weighed out and mixed in a nitrogen-filled glovebox. The resultant mixture is introduced into a molybdenum crucible and transferred into a tubular furnace. The mixture is subsequently calcined for 8 hours at 1600° C. under a nitrogen/hydrogen atmosphere. After cooling, the crude phosphor is removed, briefly ground in a mortar and re-introduced into a molybdenum crucible, which is then transferred into a high-pressure oven, where the phosphor is re-calcined for 8 hours at 1600° C. under a nitrogen pressure of 65 bar. After cooling, the phosphor is removed and suspended in 100 ml of 1 molar hydrochloric acid. The resultant suspension is stirred for 3 hours, and the stirrer is subsequently switched off. After a few minutes, the supernatant is poured off, and the residue which remains is taken up again in deionised water, filtered off with suction, washed with deionised water until neutral and dried.

Example 3B

Preparation of $Sr_2Si_5N_{7.666}O_{0.5}$:Eu 17.84 g of $Sr_3N_2$, 2.655 g of EuN, 22.21 g of silicon nitride and 1.502 g of silicon dioxide are weighed out and mixed in a nitrogen-filled glovebox. The resultant mixture is introduced into a molybdenum crucible and transferred into a tubular furnace. The mixture is subsequently calcined for 8 hours at 1600° C. under a nitrogen/hydrogen atmosphere. After cooling, the crude phosphor is removed, briefly ground in a mortar and re-introduced into a molybdenum crucible, which is then transferred into a high-pressure oven, where the phosphor is re-calcined for 8 hours at 1600° C. under a nitrogen pressure of 65 bar.

After cooling, the phosphor is removed and suspended in 100 ml of deionised water. The resultant suspension is stirred for 30 minutes, and the stirrer is subsequently switched off. After a few minutes, the supernatant is poured off, and the residue which remains is taken up again in deionised water, filtered off with suction, washed with deionised water until neutral and dried.

Example 3C

Preparation of the Phosphor $Sr_2Si_5N_8$:Eu 1.84 g of $Sr_3N_2$, 0.166 g of EuN and 2.33 g of silicon nitride are weighed out and mixed in a nitrogen-filled glovebox. The resultant mixture is introduced into a molybdenum crucible and transferred into a tubular furnace. The mixture is subsequently calcined for 8 hours at 1600° C. under a nitrogen/hydrogen atmosphere. After cooling, the crude phosphor is removed, briefly ground in a mortar and re-introduced into a molybdenum crucible, which is then transferred into a high-pressure oven, where the phosphor is re-calcined for 8 hours at 1600° C. under a nitrogen pressure of 65 bar. After cooling, the phosphor is removed and suspended in 100 ml of deionised water. The resultant suspension is stirred for 30 minutes, and the stirrer is subsequently switched off. After a few minutes, the supernatant is poured off, and the residue which remains is taken up again in deionised water, filtered off with suction, washed with deionised water until neutral and dried.

Example 3D

Preparation of the Phosphor (Sr,Ca)AlSiN$_3$:Eu 2.22 g of $Sr_3N_2$, 0.33 g of $Ca_3N_2$, 0.05 g of EuN, 1.23 g of AlN and 1.4 g of silicon nitride are weighed out and mixed in a nitrogen-filled glovebox. The resultant mixture is introduced into a boron nitride crucible and transferred into a hot isostatic press (HIP). A nitrogen pressure of 500 bar is established, and the material is subsequently heated to 1700° C. and conditioned at this temperature for 4 hours, during which the pressure rises to 1740 bar. After cooling and ventilation, the material is removed and suspended in 100 ml of deionised water. The resultant suspension is stirred for 30 minutes, and the stirrer is subsequently switched off. After a few minutes, the supernatant is poured off, and the residue which remains is taken up again in deionised water, filtered off with suction, washed with deionised water until neutral and dried.

4. Preparation of Phosphor Mixtures

Example 4.1

$Ba_{2.178}Eu_{0.022}Lu_{1.8}(PO_4)_{2.2}(SiO_4)_{0.8}$ Nitride 10 g of the phosphor from Example 1 are mixed intimately with 1 g of the phosphor from Example 3C.

A mixture comprising the phosphors from Examples 1 and 3A or 1 and 3B or 1 and 3D is prepared analogously.

Example 5

Production of a Light-Emitting Diode

The phosphor mixture from Example 4.1 is mixed with a 2-component silicone (OE 6550 from Dow Corning) in a tumble mixer in such a way that equal amounts of the phosphor mixture are dispersed in the two components of the silicone; the total concentration of the phosphor mixture in the silicone is 8% by weight.

5 ml of each of the two phosphor-containing silicone components are mixed homogeneously with one another and transferred into a dispenser. Empty LED packages from OSA optoelectronics, Berlin, which contain a 100 μm$^2$ GaN chip are filled with the aid of the dispenser. The LEDs are then placed in a heat chamber in order to solidify the silicone over 1 h at 150° C.

| Composition | Emission max. [nm] | CIE 1931 x, y | Quantum yield at 420 nm* | Lumen equivalent [lm/W] |
|---|---|---|---|---|
| $Ba_{2.178}Eu_{0.022}Lu_{1.8}$—$(PO_4)_{2.2}(SiO_4)_{0.8}$ | 580 | 0.436 0.467 | 85% | 301 |
| $Ba_{2.178}Eu_{0.022}Lu_{1.8}$—$(PO_4)_{2.2}(SiO_4)_{0.8}$ | 575 | 0.426 0.472 | 80% | 307 |

Figure 1:
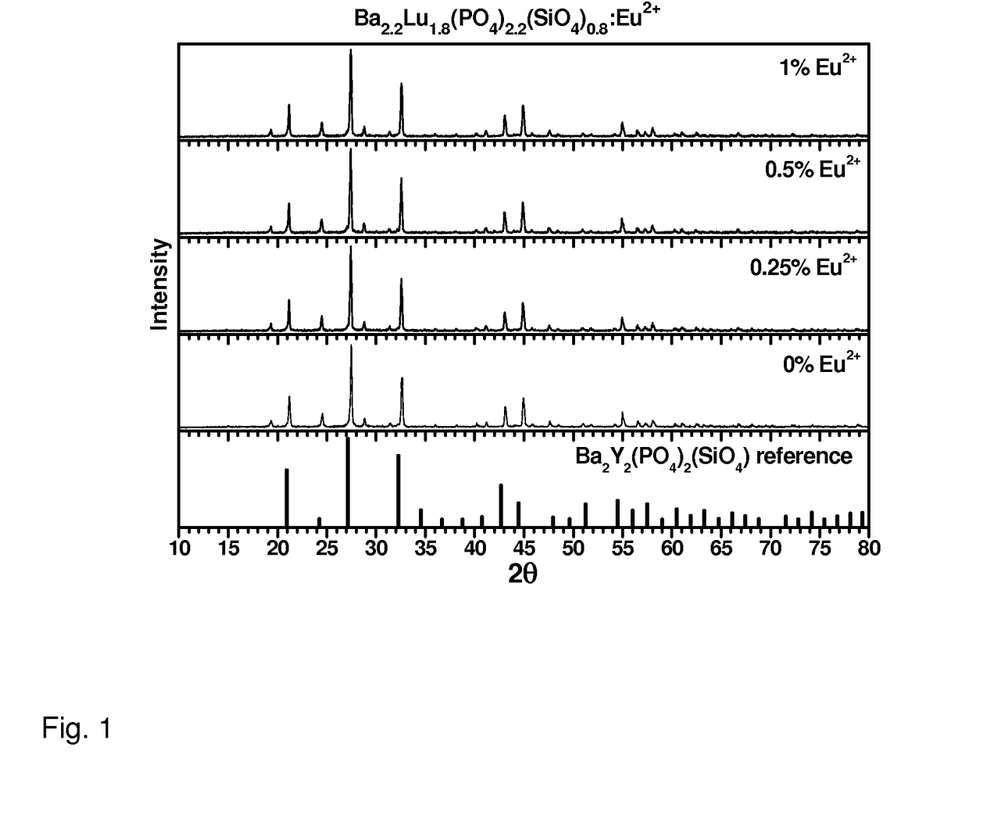
FIG. 1: shows a comparison of the X-ray diffraction patterns of phosphors of the composition $Ba_{2.2}Lu_{1.8}(PO_4)_{2.2}(SiO_4)_{0.8}$ without doping and with $Eu^{2+}$ doping (0.25-1.0%) with the diffraction pattern of the reference $Ba_2Y_2(PO_4)_2(SiO_4)$. The X-ray diffraction patterns were recorded using a Rigaku Miniflux II using Cu-K-alpha radiation. The measurement range 2 theta was 10-80°.
Figure 2:
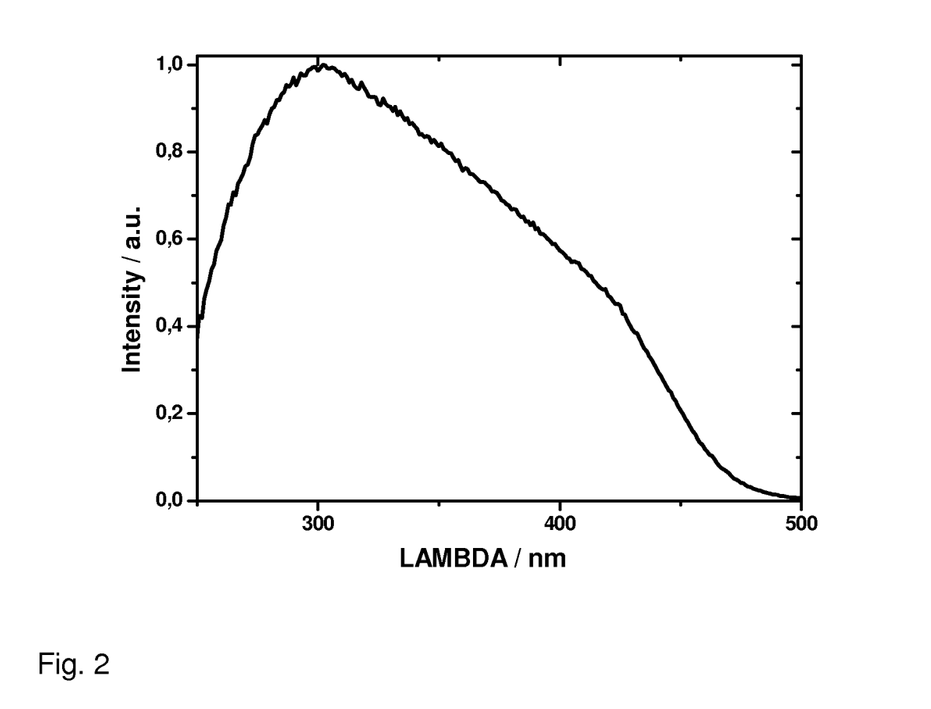
Figure 3:
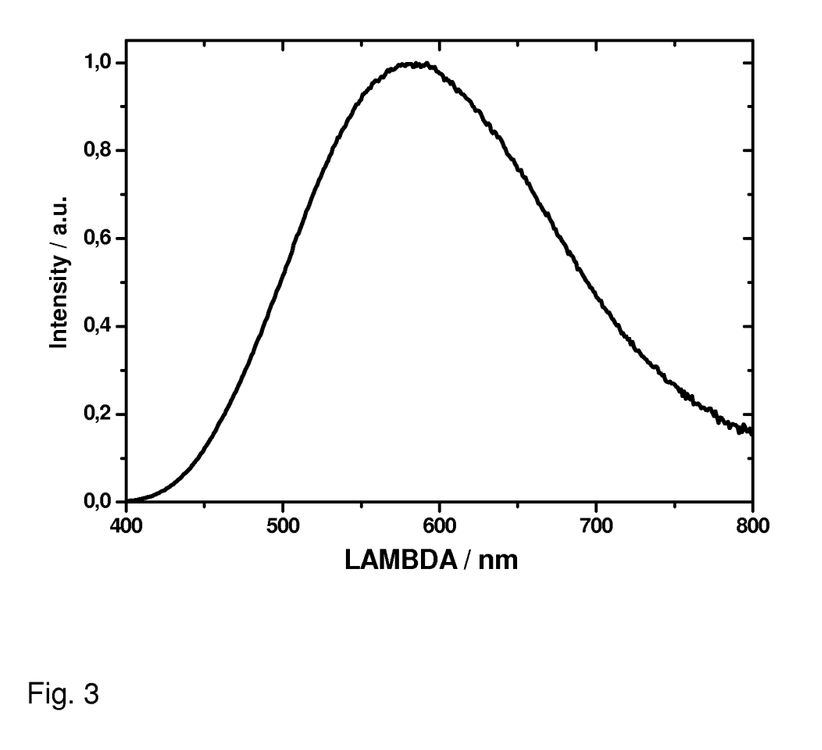
Figure 4:
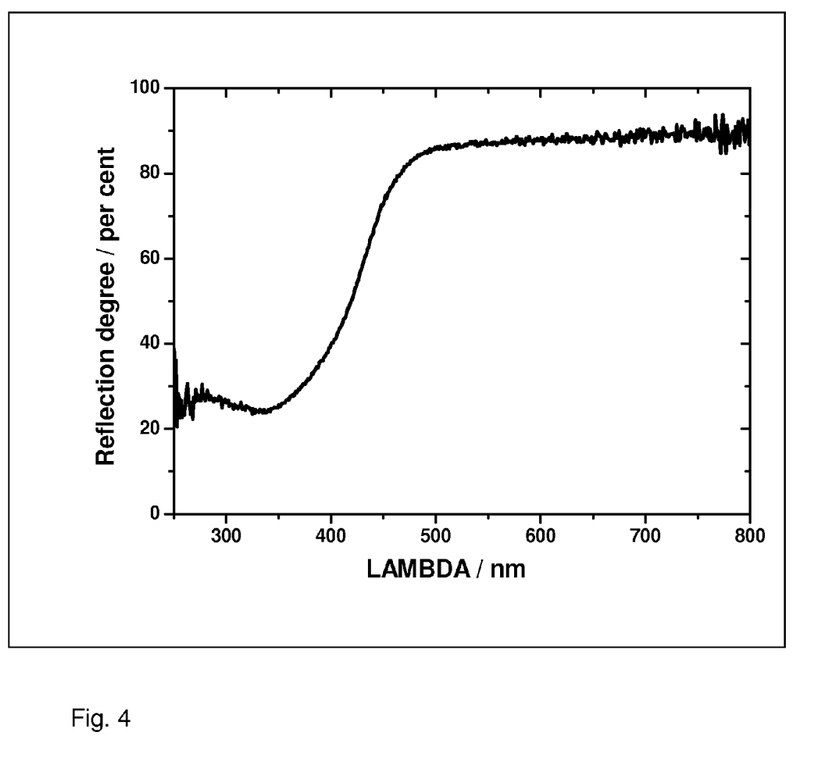
Figure 5:
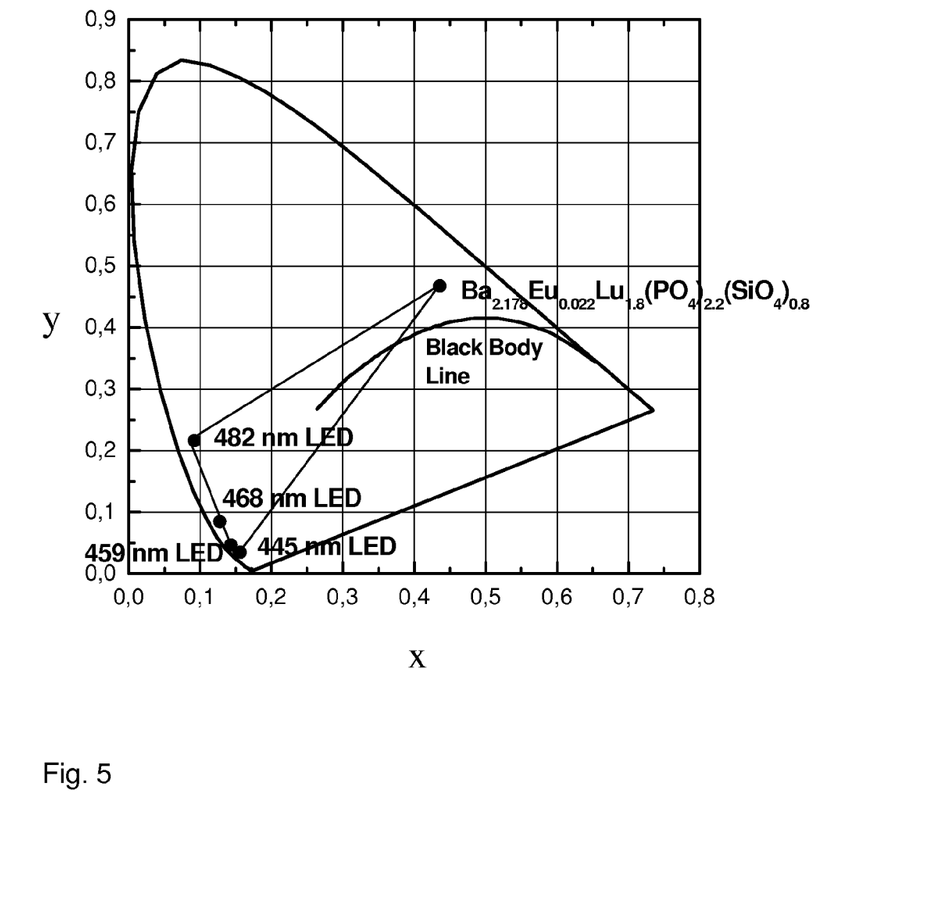
FIG. 5: shows a CIE 1931 colour chart with the colour point of $Ba_{2.178}Eu_{0.022}Lu_{1.8}(PO_4)_{2.2}(SiO_4)_{0.8}$ and diverse blue LEDs (from Lumileds Luxeon) and the black body line (BBL), which represents the change in the colour point of a Planckian radiator with temperature.
Figure 6:
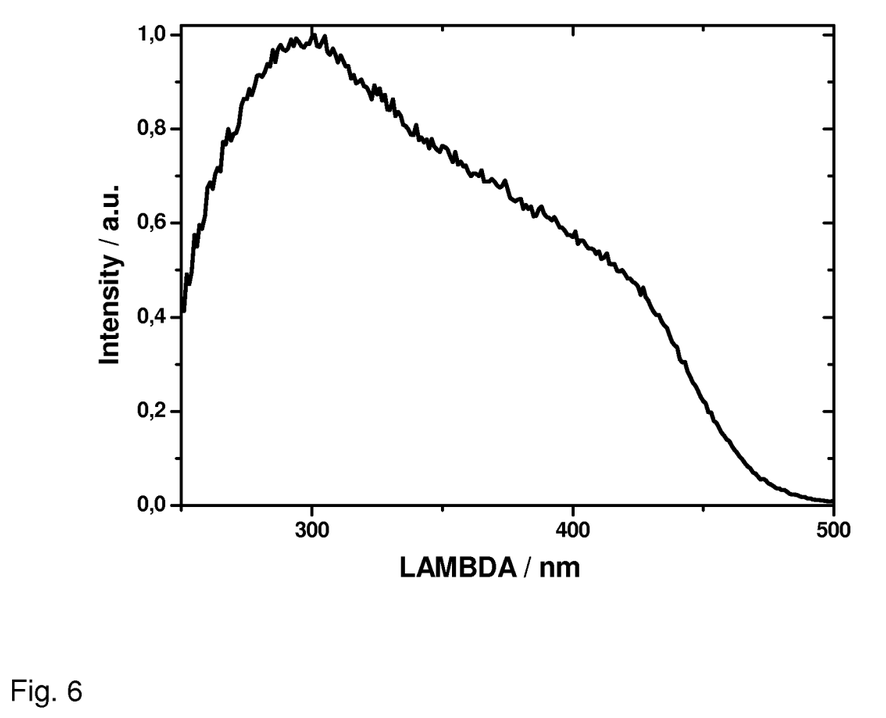
Figure 7:
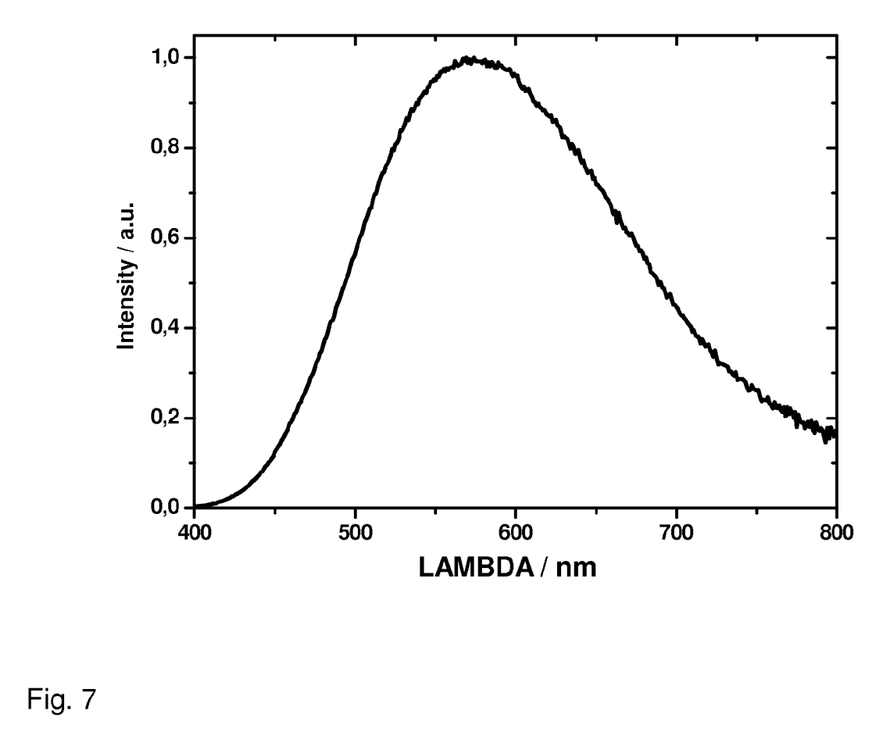
Figure 8:
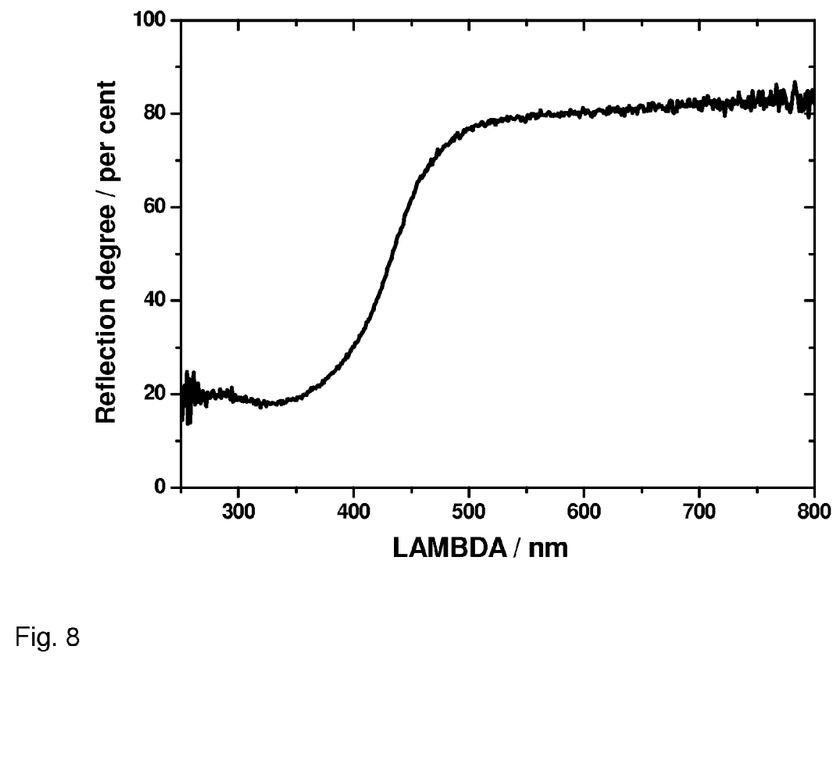
Figure 9:
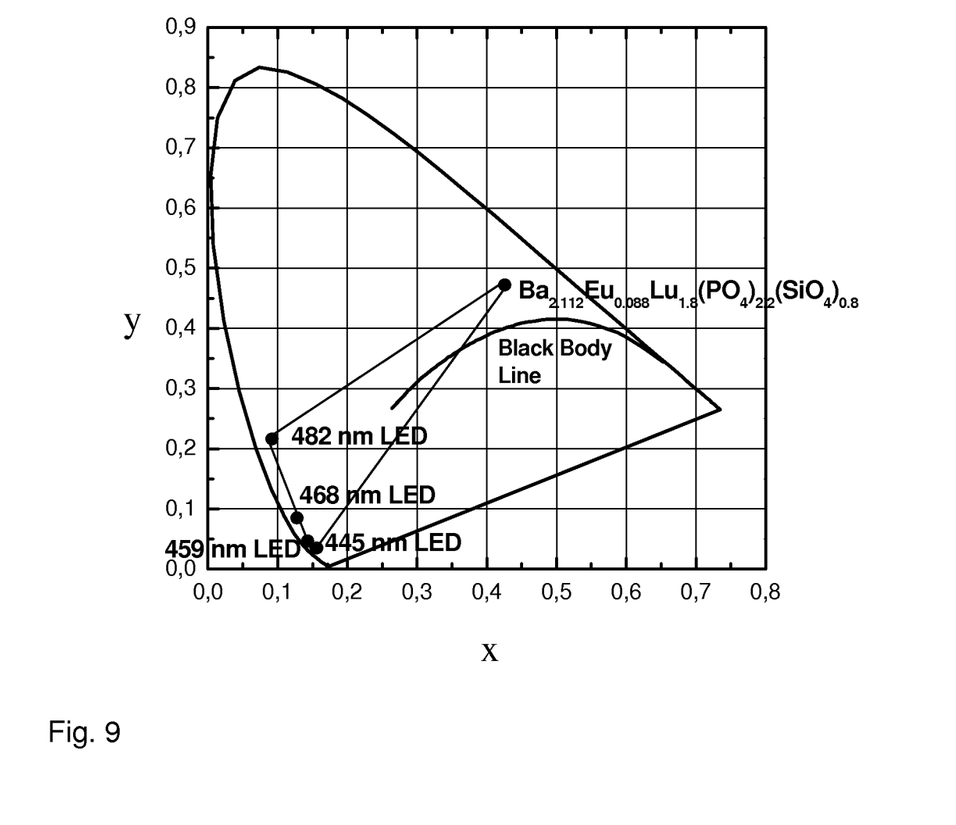
FIG. 9: shows a CIE 1931 colour chart with the colour point of $Ba_{2.112}Eu_{0.088}Lu_{1.8}(PO_4)_{2.2}(SiO_4)_{0.8}$ and diverse blue LEDs (from Lumileds Luxeon) and the black body line (BBL), which represents the change in the colour point of a Planckian radiator with temperature.

*Quantum yields were determined from the emission spectra (see FIGS. 3 and 7) and the reflection degrees at 420 nm Table 1 shows the optical properties of the phosphors according to the invention CIE x and CIE y stand for the coordinates in the standard CIE colour chart (here standard observer 1931), familiar to the person skilled in the art, by means of which the colour of a light source is described.

All the quantities mentioned above are calculated from emission spectra of the light source by methods familiar to the person skilled in the art.

The lumen equivalent (lm/W) arises from the product of the standardised emission spectrum l (lambda) and the eye sensitivity curve V (lambda).

DESCRIPTION OF THE FIGURES

FIG. 2: shows an excitation spectrum of $Ba_{2.178}Eu_{0.022}Lu_{1.8}(PO_4)_{2.2}(SiO_4)_{0.8}$. The spectrum was recorded on a powder layer of semi-infinite thickness using an Edinburgh Instruments FL900 spectrometer using an Xe high-pressure lamp and a Hamamatsu photomultiplier at room temperature.

FIG. 3: shows the standardised emission spectrum of $Ba_{2.178}Eu_{0.022}Lu_{1.8}(PO_4)_{2.2}(SiO_4)_{0.8}$. The spectrum was recorded on a powder layer of semi-infinite thickness using an Edinburgh Instruments FL900 spectrometer using an Xe high-pressure lamp and a Hamamatsu photomultiplier at room temperature.

FIG. 4: shows a reflection spectrum of $Ba_{2.178}Eu_{0.022}Lu_{1.8}(PO_4)_{2.2}(SiO_4)_{0.8}$. The spectrum was recorded on a powder layer of semi-infinite thickness using an Edinburgh Instruments F920 spectrometer in an Ulbricht sphere using an Xe high-pressure lamp and a Hamamatsu photomultiplier at room temperature.

FIG. 6: shows an excitation spectrum of $Ba_{2.112}Eu_{0.088}Lu_{1.8}(PO_4)_{2.2}(SiO_4)_{0.8}$. The spectrum was recorded on a powder layer of semi-infinite thickness using an Edinburgh Instruments FL900 spectrometer using an Xe high-pressure lamp and a Hamamatsu photomultiplier at room temperature.

FIG. 7: shows the standardised emission spectrum of $Ba_{2.112}Eu_{0.088}Lu_{1.8}(PO_4)_{2.2}(SiO_4)_{0.8}$. The spectrum was recorded on a powder layer of semi-infinite thickness using an Edinburgh Instruments FL900 spectrometer using an Xe high-pressure lamp and a Hamamatsu photomultiplier at room temperature.

FIG. 8: shows a reflection spectrum of $Ba_{2.112}Eu_{0.088}Lu_{1.8}(PO_4)_{2.2}(SiO_4)_{0.8}$. The spectrum was recorded on a powder layer of semi-infinite thickness using an Edinburgh Instruments F920 spectrometer in an Ulbricht sphere using an Xe high-pressure lamp and a Hamamatsu photomultiplier at room temperature.

The invention claimed is:

1. A Compound of the formula I:

$$(Ba_{1-a-b}Sr_aEu_b)_{2+x}(Lu_{1-c-d}Y_cGd_d)_{2-x}(PO_4)_{2+x}(SiO_4)_{1-x} \quad (I)$$

where;
b stands for a value from the range 0<b≤0.2;
a, c, d stand, independently of one another, for a value from the range from 0 to 1; and
x stands for a value from the range from 0 to 0.8.

2. A Compound according to claim 1, wherein x stands for a value from the range from 0.05 to 0.50.

3. A mixture comprising at least one compound of the formula I according to claim 1 and at least one red-emitting phosphor.

4. A mixture according to claim 3, wherein the at least one red-emitting phosphor is selected from Ce-doped garnets, Eu-doped thiogallates, Eu-doped sulfoselenides, Eu-and/or Ce-doped nitrides, oxynitrides, alumonitrides and/or Mn(IV)-doped oxides and/or fluorides.

5. Mixture A mixture according to claim 3, wherein the at least one red-emitting phosphor is selected from nitridic phosphors.

6. A mixture according to claim 3, wherein the at least one red-emitting phosphor is selected from:$(Ca,Sr,Ba)_2Si_5N_8$:Eu, $(Ca,Sr)AlSiN_3$:Eu, $(Ca,Sr,Ba)SiN_2$:Eu, $(Ca,Sr,Ba)_6Si_3O_6N_4$:Eu, or $(Ca,Sr,Ba)_{2-x/2}Si_5N_{8-x}O_x$:Eu, where x stands for a number from the range 0.01 to 3.

7. A light source, which comprises a semiconductor and at least one compound of the formula I according to claim 1.

8. A light source according to claim 7, wherein the semiconductor is a luminescent indium aluminium gallium nitride.

9. A method for the partial or complete conversion of the blue or near-UV emission from a luminescent diode comprising subjecting the emission to a conversion phosphor containing a compound of claim 1.

10. A lighting unit which comprises at least one light source according to claim 7.

11. A lighting unit according to claim 10, wherein the optical coupling between the compound of the formula I and the semiconductor is achieved by a light-conducting arrangement.

12. Display A display device which comprises at least one lighting unit according to claim 10.

13. A display device according to claim 12 which is a liquid-crystal display device.

14. A lighting unit according to claim 10 which is a lighting unit for the backlighting of display devices.

15. A light source according to claim 7, wherein the semiconductor is a luminescent indium aluminium gallium nitride of the formula $In_iGa_jAl_kN$, where 0<i, 0<j, 0<k, and i+j+k=1.

16. Process A process for the preparation of a compound of the formula I:

$$(Ba_{1-a-b}Sr_aEu_b)_{2+x}(Lu_{1-c-d}Y_cGd_d)_{2-x}(PO_4)_{2+x}(SiO_4)_{1-x} \quad (I)$$

where:
b stands for a value from the range 0<b<0.2;
a, c, d stand, independently of one another, for a value from the range from 0 to 1; and
x stands for a value from the range from 0 to 0.8,
comprising the following process steps:
a) mixing of lutetium-, europium-, silicon-, barium-, strontium-, yttrium-, gadolinium- and/or phosphate-containing materials,
b) addition of at least one further inorganic and/or organic substance, and
c) thermal treatment of the mixture.

17. A process according to claim 16, characterised wherein the inorganic or organic substances used in step b) are selected from the group consisting of the ammonium halides, alkaline-earth metal fluorides, borates, boric acid, carbonates, alcoholates, and silicic acid esters.

18. A process according to claim 16, wherein the thermal treatment of the mixture is carried out in a plurality of steps.

19. A compound according to claim 1, wherein x stands for a value from the range from 0.1 to 0.3.

20. A process according to claim 16, wherein the inorganic or organic substances used in step b) are selected from the group consisting of the calcium fluoride, strontium fluoride, barium fluoride, ammonium hydrogencarbonate, oxalates and the silicic acid ester TEOS.

21. A process according to claim 16, wherein the thermal treatment of the mixture is carried out in three steps.

22. A process for the preparation of a mixture comprising at least one red-emitting phosphor and at least one compound of the formula I:

$$(Ba_{1-a-b}Sr_aEu_b)_{2+x}(Lu_{1-c-d}Y_cGd_d)_{2-x}(PO_4)_{2-x}(SiO_4)_{1-x} \quad (I)$$

where:
b stands for a value from the range 0<b<0.2;
a, c, d stand, independently of one another, for a value from the range from 0 to 1; and
x stands for a value from the range from 0 to 0.8,
wherein the at least one compound of the formula I is mixed with at least one red-emitting phosphor.

* * * * *